United States Patent
Bernstein et al.

(10) Patent No.: US 7,508,250 B1
(45) Date of Patent: Mar. 24, 2009

(54) TESTING FOR NORMAL OR REVERSE TEMPERATURE RELATED DELAY VARIATIONS IN INTEGRATED CIRCUITS

(75) Inventors: Kerry Bernstein, Underhill, VT (US); David Wolpert, Rochester, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/180,938

(22) Filed: Jul. 28, 2008

(51) Int. Cl.
    *H01L 35/00* (2006.01)
(52) U.S. Cl. ............... 327/512; 327/261; 327/278; 374/163; 702/130; 377/25
(58) Field of Classification Search ............ None
    See application file for complete search history.

(56) References Cited

U.S. PATENT DOCUMENTS

| | | | |
|---|---|---|---|
| 6,150,863 A | * | 11/2000 | Conn et al. ............ 327/270 |
| 7,107,178 B2 | * | 9/2006 | Won et al. ............ 702/130 |
| 7,248,091 B2 | | 7/2007 | Chung |
| 2007/0176661 A1 | | 8/2007 | Shin |
| 2008/0174350 A1 | * | 7/2008 | Shin et al. ............ 327/158 |

* cited by examiner

*Primary Examiner*—Long Nguyen
(74) *Attorney, Agent, or Firm*—Cantor Colburn LLP; W. Riyon Harding

(57) ABSTRACT

A method for determining that a circuit is operating in the reverse temperature dependence domain includes creating baseline delay information, detecting a temperature change with one or more temperature sensors, after detecting the temperature change, creating current delay information, comparing the baseline delay information with the current delay information, determining that the temperature change was a positive change; determining that the current delay information indicates that the circuit is operating faster when the baseline delay information was taken.

1 Claim, 3 Drawing Sheets

TESTING FOR NORMAL OR REVERSE TEMPERATURE RELATED DELAY VARIATIONS IN INTEGRATED CIRCUITS

BACKGROUND

The present invention relates to testing integrated circuits (IC's), and more specifically, to testing for normal or reverse temperature related delay variations in integrated circuits.

Over the past few technology generations, increased power densities and low-power techniques have made the effects of temperature variation on integrated circuits (or "chips") an increasingly important problem. Temperature changes may affect, for example, signal propagation delays in the IC. Thus, awareness of temperature related performance effects is critically important for maintaining system functionality.

Increasing power densities affect temperature in at least two ways. For a single circuit on an IC, higher densities mean a larger temperature difference between when the circuit is idling and when it is switching heavily. This increase in temperature differences also directly affects system delays. For an IC as a whole, the higher power densities result in a larger gradient between a high-activity core and low-activity nest logic, approaching 50° C. in some cases.

The delay dependence is proportional to the operating voltage. This means that low-power techniques such as dynamic voltage scaling make it even more difficult to determine the actual circuit latency. In newer technologies, this problem is compounded by the reverse temperature effect (which occurs at higher voltages as technologies scale). The "reverse" domain (or reverse temperature dependence domain) is the voltage domain in which an increase in temperature causes an increase in on-current and increases circuit speed. This is opposed to general ("normal") circuit behavior where an increase in temperature reduces the on-current and reduces circuit speed. This occurs below some voltage threshold, usually called the temperature-invariant voltage. In both the normal and reverse domains the leakage current still has the same exponential dependence on temperature. The reason for this reversal at lower voltages is a function of the changing proximity to the threshold voltage—the temperature effects on mobility and threshold voltage trade-off, meaning that as temperatures increase, delay can increase or decrease depending on the operating voltage.

SUMMARY

One embodiment of the present invention in directed to a method for determining whether a circuit is operating in a reverse temperature dependence domain. The method of this embodiment includes creating baseline delay information, the baseline delay information being created by generating a plurality of staggered clock pulses with a staggered pulse generator, applying the staggered clock pulses to a delay propagation circuit, and measuring the time signals present on delay lines in the delay propagation circuit by latching the values present thereon upon receipt of a clock signal; detecting a temperature change with one or more of the temperature sensors, detecting including determining whether the change is a positive change or a negative change; detecting the temperature change, creating current delay information; comparing the baseline delay information with the current delay information; determining that the temperature change was a positive change; determining that the current delay information indicates that the circuit is operating faster when the baseline delay information was taken by comparing the current delay information to the baseline delay information; and indicating that the circuit is operating in the reverse temperature dependence domain.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Embodiments of the present invention provide a simple, low power system for determining which temperature domain (normal or reverse) a particular circuit is functioning. This determination may be used, for example, to adapt operating conditions of the circuit as circuit temperature changes.

One possible advantage of embodiments of the present invention may be that it provides a better degree of control to the circuit designer, as changes specifically due to temperature variation can be handled separately from voltage and process variations. Without this information, a design could assign delay margins incorrectly, resulting in wasted performance. For example, if a system is designed only for the normal domain but is operating in the reverse domain, an increase in temperature would make the system slow itself down even though it could in fact be sped up. Embodiments of the present invention and related methods also avoid the need for continuous feedback systems, instead using discrete temperature measurements and the temperature region to adjust to new voltage or frequency levels when necessary.

A preferred embodiment of a system according to the present invention includes an off-chip 'clock burst' (a set of slightly staggered clock pulses) which will pass through an on-chip delay chain and into a bank of registers running on a system clock. When the system clock triggers the register bank, some of the later burst pulses will not be captured, resulting in a thermometer code. This information can then be stored separately and repeated when an on-chip thermal sensor detects some finite change. Comparing the two thermometer codes will determine whether the circuit has gotten faster or slower, and combining that result with the change from the thermal sensor can provide the current temperature region (normal or reverse). The system can be designed to work at multiple voltages. As an alternative to the 'clock burst', a single clock could be split up using buffers provided the delay lines are long enough to provide accurate results.

Figure 1:
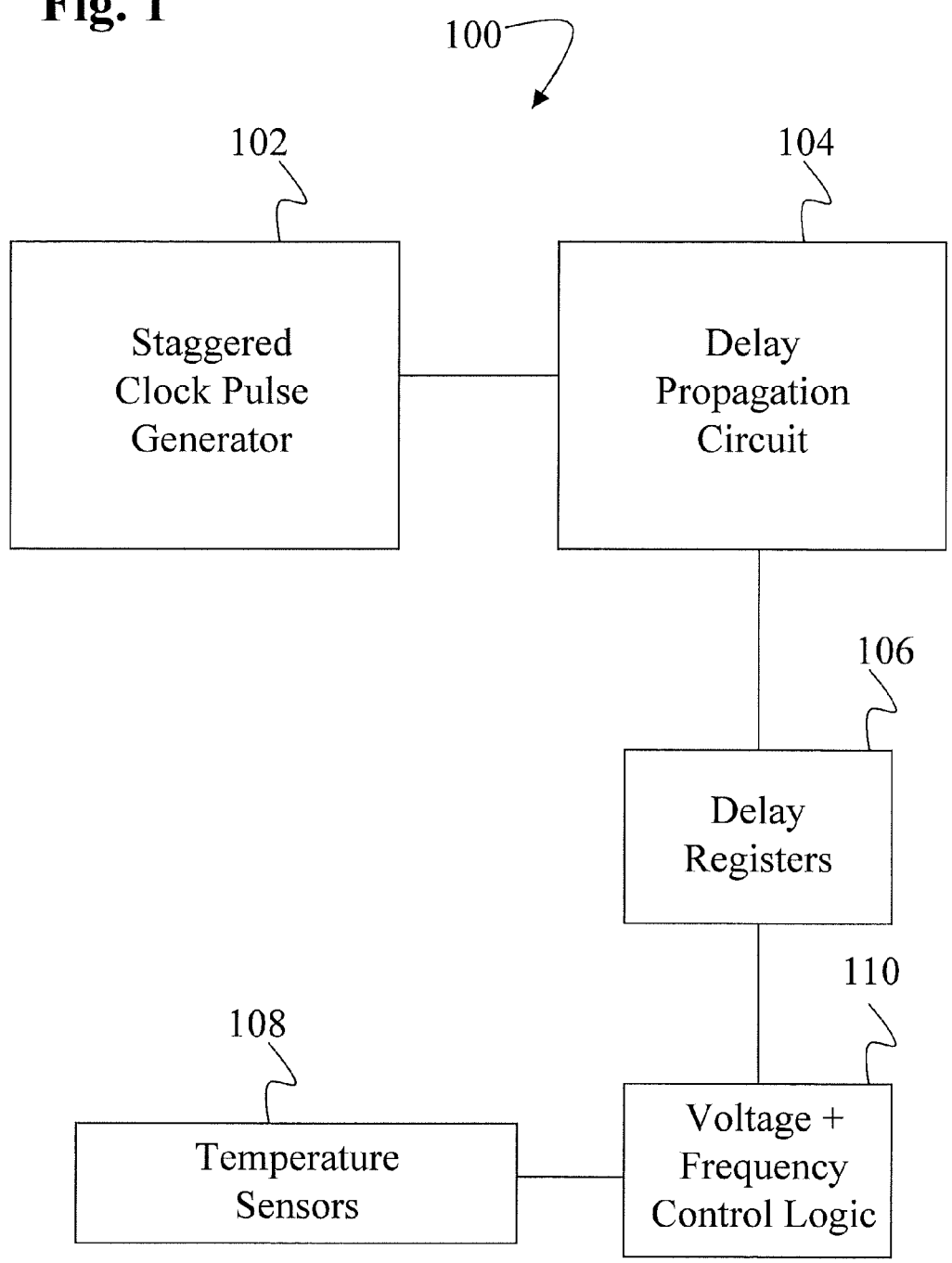
FIG. 1 is system diagram of a system according to one embodiment of the present invention.

FIG. 1 shows a system 100 according to one embodiment of the present invention. The system 100 includes a staggered clock pulse generator 102. The staggered clock pulse generator 102, in one embodiment, may be located "off-chip." Of course, because the system 100 is designed to determine delays in a chip or a location in the chip due temperature variations, if the staggered clock pulse generator 102 is located on-chip it should be thermally insulated from other portions of the chip. In general, the staggered clock pulse generator 102 is configured to create a plurality of clock pulse signals where each signal is a slightly delayed version of a prior signal. In one embodiment, the clock pulse generator 102 may be comprised of several step function generators configured such that the first generator generates a first step function, the second pulse generator generates a second step function that is slightly delayed from the first, and so on.

The staggered clock pulse generator 102 is coupled to a delay propagation circuit 104. The delay propagation circuit 104 is located on-chip. In one embodiment, the delay propagation circuit 104 comprises a plurality of delay elements that serve as buffers for the step functions. In that embodiment, the delay elements are serially connected to form delay lines and may include signal tap locations located between the delay items. Depending on the input voltage, the location of taps used to measure the propagation of the signals may vary and depends on the context.

The system also includes delay registers 106 coupled to the delay propagation circuit 104. In more detail, the delay registers 106 may include a plurality of registers, each register being coupled (either directly or through a multiplexer) to the taps in the delay propagation circuit. The delay registers 106, based on a system clock pulse, capture the propagation of the staggered clock pulses as they pass through the delay propagation circuit 104. In more detail, each register in the delay registers 106 is coupled to a particular delay line in the delay propagation circuit 104. Each delay line includes one of the staggered clock pulses. Based on how many of the delay lines have propagated the signals to a certain point therein, a determination of the whether the speed (based on a variation from a baseline measurement) has increased or decreased with a temperature change may be made.

The system 100 may also include voltage and frequency control logic 110. The voltage and frequency control logic 110 is coupled to the delay registers as well as temperature sensors 108. Based on the output of the temperature sensors 108 and the delay registers 110 the voltage and frequency control logic 110 may determine if the chip is operating in the normal or reverse temperature region as described in greater detail below. Based on this determination, the operating voltage and clock frequency provided to the chip may be determined by the voltage and frequency control logic 110.

Figure 2:
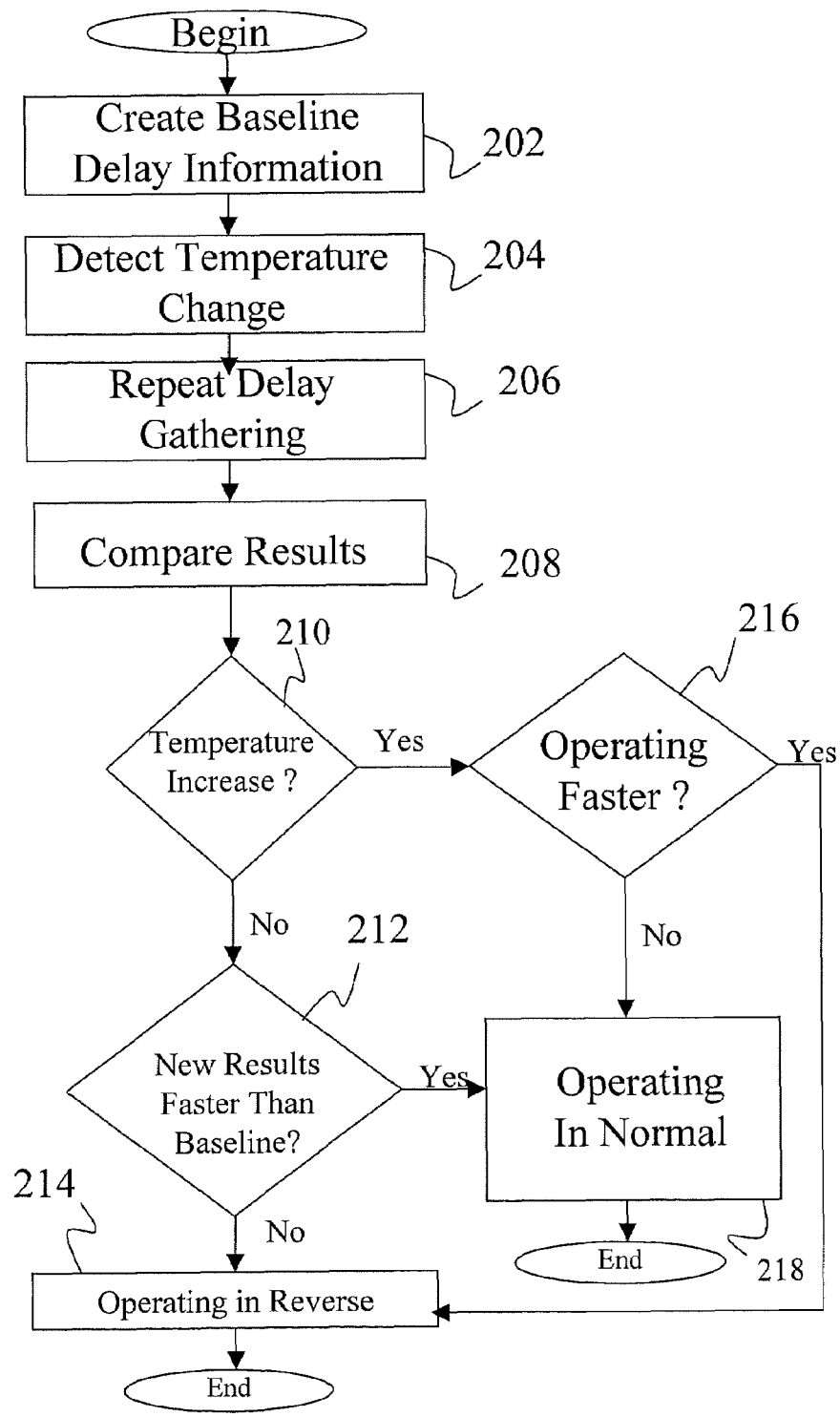
FIG. 2 is a flow diagram of method of determining the delay operation condition of a circuit according to one embodiment of the present invention.

FIG. 2 shows a method of determining whether a circuit is operating in the normal or reverse temperature mode according to one embodiment of the present invention. At a block 202 baseline delay information is gathered. In one embodiment, it is assumed that the baseline delay information is gathered when the chip is operating in the normal temperature mode. A more detailed explanation of how baseline and other delay information is gathered is provided below. In general, however, the baseline delay information is gathered by providing staggered clock pulses to a delay propagation circuit. Each delay line contained in the delay propagation circuit receives a different one of the staggered clock pulses. At a fixed time (such as on a system clock pulse) the value present at a particular location on each delay is measured and stored in delay registers. The value stored in each of the registers may be interpreted to either set a baseline or to determine if the system is operating faster or slower than the baseline when the temperature has changed. Of course, the operating voltage may be varied so that multiple voltage dependent baseline delay values may be created.

At a block 204, a temperature change is detected. The change may be either a positive or negative change as compared to a baseline temperature. For example, the baseline delay information created at block 202 may include a baseline temperature. Any change, either above or below this baseline temperature, may indicate that circuit operating characteristics have changed. Of course, the temperature change may not be large enough to cause any change in the operating characteristics of the circuit and the amount of temperature change required is user configurable.

At a block 206, delay information is again gathered after a sufficient temperature change has been detected. At a block 208, the delay information gathered at block 206 is compared to the baseline delay.

At decision block 210, it is determined whether the temperature change detected at block 204 is an increase or decrease in temperature. If it is an increase and the circuit is operating faster, as determined at decision block 216, the system is operating under a reverse temperature effect as indicated at a block 214. That is, the increase in temperature is causing the circuit to operate faster. Otherwise, if the temperature change was an increase and the circuit is operating slower, the circuit is operating under the normal temperature effect as indicated at block 218.

Referring back to decision block 210, if the temperature change is a decrease and the new delay is less than the baseline (i.e., the circuit is operating faster) as determined at decision block 212, the circuit is operating under the reverse temperature effect as indicated at block 214. Otherwise, as indicated at a block 218, the circuit is operating under the normal temperature effect.

In the prior art, temperature sensing devices that are controlled by the current through a resistor do not have the same mobility/threshold voltage trade-off of active devices that results in this reverse temperature effect. Embodiments of the present invention recognize this and systems according to embodiments of the present invention may reduce the possibility of system failure. As discussed above, other methods of sensing temperature indirectly exist, such as a ring oscillator which measures PVT-variation combined resulting in a variation-dependent operating frequency. Embodiments of the present invention may be much less complex than a ring oscillator with frequency detection systems.

Figure 3:
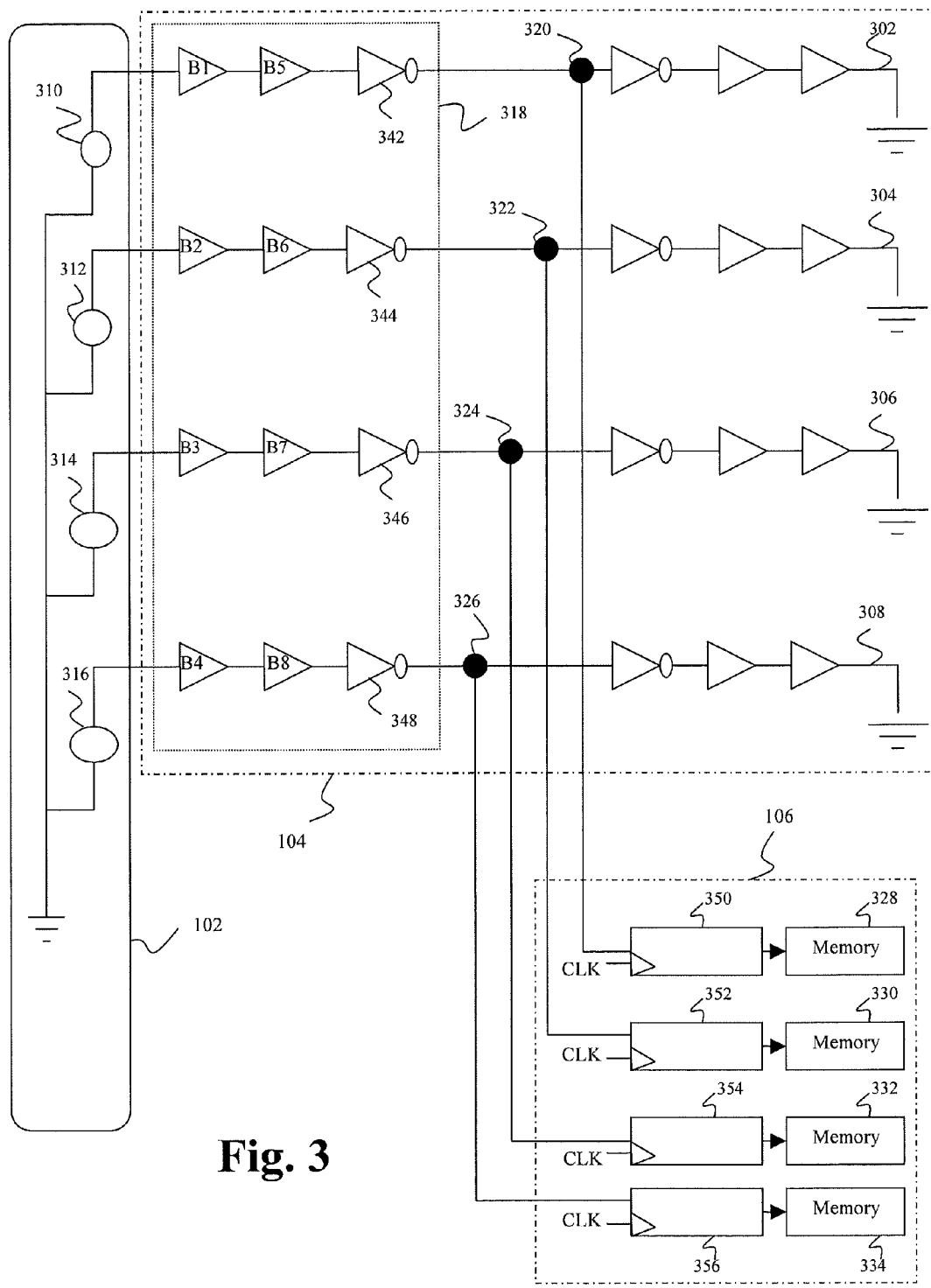
FIG. 3 is a more detailed depiction of a portion of the system shown in FIG. 1.

FIG. 3 shows a more detailed depiction of a portion of the system shown in FIG. 1. In particular, FIG. 3 shows more detailed depictions of one possible embodiment of the staggered clock pulse generator 102, the delay propagation circuit 104 and the delay registers 106.

The staggered clock pulse generator 102, in this embodiment, includes four separate pulse generators 310, 312, 314, and 316. The number of pulse generators is not limited to four and any number will suffice. Each pulse generator is arranged so that the pulse it produces is slightly delayed from a pulse generated by a prior pulse generator. For example, if the leading edge of a pulse generated by the first pulse generator 310 occurs at a time $t_0$, the leading edge of a pulse generated by the second pulse generator 312 occurs at time $t_0+x$, where x is a positive number. Similarly, the leading edge of a pulse generated by the third pulse generator 314 occurs at a time to +y. In one embodiment, y=2x.

One or more of the pulse generators in the staggered clock pulse generator 102 is coupled to a delay line in the delay propagation circuit 104. For example, the first pulse generator 102 is coupled to the first delay line 302, the second pulse generator 312 is coupled to the second delay line 304, the third pulse generator 314 is coupled to the third delay line 306 and the fourth pulse generator 316 is coupled to the fourth delay line 308. In some embodiments, the number of delay lines may depend on the granularity required, the greater the granularity required, the more delay lines are required. Further, as the number of delay lines increases, it may be advantageous to decrease the value of delay time x described above.

In one embodiment, each delay line is comprised of a plurality of serially connected buffer elements. For instance, the first delay line 302 may be comprised of buffer elements B1, B5 and inverter 342. The inverter 342 is also a buffer element and it is not required that the delay line include an inverter at all. The first delay line 302 may also include additional buffer elements. The number of buffer elements is a matter of user preference.

Each delay line includes one or more tap connection points. For example, the first delay line 302 includes a first tap location 320, the second delay line 304 includes a second tap location 322, the third delay line 306 includes a third tap location 324 and the fourth delay line 308 includes a fourth tap location 326. In one embodiment, the tap locations are between two inverters on a particular delay line. Of course, the tap locations could be located in different locations than those shown in FIG. 3 and may be placed, for example, at any location deemed appropriate by the circuit designer.

In operation, the staggered clock pulse generator 102 provides a "clock burst" of staggered pulses. The pulses propagate through the delay propagation circuit 104 and, upon the receipt of system clock signal, the values on the delay lines (e.g., delay lines 302, 304, 306 and 308) at the tap locations (e.g., locations 320, 322, 324 and 326) are stored in the delay registers 106. These values may, respectively, be stored in optional memory locations.

In more detail, each delay line may be coupled to a latch in the delay registers 106. For example, the first delay line 302 may be coupled to a first latch 350, the second delay line 304 may be coupled to a second latch 352, the third delay line 306 may be coupled to a third latch 354 and the fourth delay line 308 may be coupled to a fourth latch 356. Each latch may be coupled to a memory location. For example, the first latch 350, the second latch 352, the third latch 354 and the fourth latch 356 may be coupled, respectively, to the first memory 328, the second memory 330, the third memory 332 and the fourth memory 334. The memory locations could be discrete or could be part of general system memory.

It should be understood that the clock pulses described herein may actually be implemented as a change of voltage from a first value to a second value for a specified time period. As discussed above, the clock pulses are delayed from one another. When the latches receive the system clock pulse, they latch in the values on the delay lines on to which they are coupled.

In one embodiment, this process is performed to create a baseline speed. At a later time, the process may be performed again when a temperature change has occurred. Based on the speed and the temperature change it may be determined if the chip is operating in the normal or reverse temperature region.

In one embodiment, a numbering convention for the buffers as shown in FIG. 3 may be employed. The highest number of the buffer (as numbered in example region 318) for which a clock pulse may be detected, determines the thermometer code. The faster the signal, the higher the code. It will be understood that the range has a non-linear dependence on voltage, which could make capturing the specific edges difficult. To tune a design a more suitable approach would be treating the inverter chains as an addressable space, as shown in FIG. 3. This would allow for variable granularity in capturing the wavefront, meaning if a larger dynamic range was needed, every second or fourth buffer element on each line in the addressing scheme could be used.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for determining whether a circuit is operating in a reverse temperature dependence domain, the circuit being formed on an integrated circuit and including a staggered pulse generator, a delay propagation circuit, delay registers coupled to the delay propagation circuit, temperature sensors and a voltage and frequency control logic, the method comprising:

creating baseline delay information, the baseline delay information being created by generating a plurality of staggered clock pulses with the staggered pulse generator, applying the staggered clock pulses to the delay propagation circuit, and measuring the time signals present on delay lines in the delay propagation circuit by latching the values present thereon upon receipt of a clock signal;

detecting a temperature change with one or more of the temperature sensors, detecting including determining whether the change is a positive change or a negative change;

creating current delay information;
comparing the baseline delay information with the current delay information;
determining that the temperature change was a positive change;
determining that the current delay information indicates that the circuit is operating faster when the baseline delay information was taken by comparing the current delay information to the baseline delay information; and
indicating that the circuit is operating in the reverse temperature dependence domain.

* * * * *